United States Patent [19]

Ito et al.

[11] Patent Number: 5,640,409
[45] Date of Patent: Jun. 17, 1997

[54] SEMICONDUCTOR LASER

[75] Inventors: Satoshi Ito; Toyoharu Ohata; Akira Ishibashi; Norikazu Nakayama, all of Kanagawa, Japan

[73] Assignee: Sony Corporation, Tokyo, Japan

[21] Appl. No.: 591,832

[22] Filed: Jan. 25, 1996

Related U.S. Application Data

[63] Continuation of Ser. No. 271,132, Jul. 6, 1994, abandoned.

[30] Foreign Application Priority Data

Jul. 2, 1993 [JP] Japan ................................. 5-190880

[51] Int. Cl.⁶ ............................................... H01S 3/19
[52] U.S. Cl. ..................................... 372/45; 372/46
[58] Field of Search ........................... 372/45, 50, 46

[56] References Cited

U.S. PATENT DOCUMENTS

| | | | |
|---|---|---|---|
| 5,260,958 | 11/1993 | Fitzpatrick | 372/45 |
| 5,268,918 | 12/1993 | Akimoto et al. | 372/45 |
| 5,296,718 | 3/1994 | Fujita et al. | 372/45 |
| 5,363,395 | 11/1994 | Gaines et al. | 372/50 |
| 5,371,756 | 12/1994 | Fujii | 372/45 |
| 5,373,521 | 12/1994 | Takahashi | 372/46 |

FOREIGN PATENT DOCUMENTS

WO 92/21170  11/1992  WIPO.

OTHER PUBLICATIONS

*Applied Physics Letters*, "Blue–green Injection Laser Diodes in (Zn,Cd)Se/ZnSe Quantum Wells", H. Jeon et al., vol. 59, No. 27, 30 Dec. 1991, pp. 3619–3621.

*Patent Abstracts of Japan*, "Semiconductor Device" F. Shigeo, vol. 17, No. 57, 4 Feb. 1993.

*Electronics Letters*, "Room Temperature Pulsed Operation of 498nm Laser with ZnMgSSe Cladding Layers", S. Itoh et al., vol. 29, No. 9 29 Apr. 1993, pp. 766–768.

*Electronics Letters*, "Ohmic Contacts to p–type ZnSe Using ZnTe/ZnSe Multiquantum Wells", F. Hiei, et al., vol. 29, No. 10, 13 May 1993, pp. 878–879.

*Applied Physics Letters*, "Blue–green Injection Lasers Containing Pseudomorphic $Zn_{1-x}Mg_xS_ySe_{10y}$ Cladding Layers and Operting up to 394 K", J.M. Gaies, vol. 62, No. 20, 17 May 1993, pp. 2462–2464.

*Primary Examiner*—Rodney B. Bovernick
*Assistant Examiner*—Yisun Song
*Attorney, Agent, or Firm*—Hill, Steadman & Simpson

[57] ABSTRACT

A semiconductor light-emitting device capable of emitting blue to green light is disclosed. The device comprises a first cladding layer of the first conduction type stacked on a compound semiconductor substrate and made of ZnMgSSe compound semiconductor; an active layer stacked on the first cladding layer; a second cladding layer of the second conduction type stacked on the active layer and made of a ZnMgSSe compound semiconductor; and ZnSSe compound semiconductor layers provided on the second cladding layer and/or between the compound semiconductor substrate and the first cladding layer. The device has good optical confinement characteristics and carrier confinement characteristics, generates only a small amount of heat during its operation, and is fabricated easily.

11 Claims, 9 Drawing Sheets

SEMICONDUCTOR LASER

This is a continuation, of application Ser. No. 08/271,132 filed Jul. 6, 1994, now abandoned.

BACKGROUND OF THE INVENTION

This invention relates to a semiconductor light-emitting device and, more particularly, to a semiconductor light-emitting device capable of emitting blue to green light such as a semiconductor laser and a light emitting diode.

In recent years, there is a demand for semiconductor light-emitting devices, particularly, semiconductor lasers capable of emitting light with short wavelengths for improving recording densities of optical disks or resolutions of laser printers, and vigorous studies have been made for realization of such devices.

II–VI compound semiconductors are hopeful as materials to be used for fabricating such semiconductor light-emitting devices capable of emitting light with short wavelengths. In particular, ZnMgSSe compound semiconductors, which are quaternary II–VI compound semiconductors, are recognized to be suitable as materials of cladding layers and optical waveguide layers required to make on a GaAs substrate a semiconductor laser for emitting blue to green light in the band of wavelengths of 400~500 nm (see, for example, Electron. Lett. 28 (1992) 1798).

Such ZnMgSSe compound semiconductors, however, involve the problem that they are variable in lattice constant and in band gap energy due to changes in their compositions and make it difficult to stably fabricate semiconductor lasers.

There is also such a problem, particularly with p-type ZnMgSSe compound semiconductors used to make p-type cladding layers, that their effective impurity concentrations enabling doping are as low as $10^{17} cm^{-3}$, which causes high resistances of p-type cladding layers and hence causes generation of heat during operation of semiconductor lasers.

OBJECTS AND SUMMARY OF THE INVENTION

It is therefore an object of the invention to provide a semiconductor light-emitting device using a ZnMgSSe compound semiconductor as the material of its cladding layer and capable of emitting blue to green light, which has good optical confinement characteristics and carrier confinement characteristics, generates only a small amount of heat during operation, and is easily fabricated.

According to an aspect of the invention, there is provided a semiconductor light-emitting device comprising:

a first cladding layer of a first conduction type stacked on a compound semiconductor substrate and made of a ZnMgSSe compound semiconductor;

an active layer stacked on the first cladding layer; and a second cladding layer of a second conduction type stacked on the active layer and made of a ZnMgSSe compound semiconductor, wherein a ZnSSe compound semiconductor layer is provided on the second cladding layer and/or between the compound semiconductor substrate and the first cladding layer.

In a preferred working form of the semiconductor light-emitting device according to the invention, the ZnSSe compound semiconductor layer is provided only on the second cladding layer.

For the reason of ensuring a sufficiently low resistance while ensuring good optical confinement characteristics and carrier confinement characteristics and for other purposes, the ZnSSe compound semiconductor layer is preferably 0.1~2 µm thick, and the second cladding layer is preferably 0.2~2 µm thick. In this case, the total thickness of the second cladding layer and the ZnSSe compound semiconductor layer is preferably chosen to be 0.4 µm or more.

In another preferable working form of the semiconductor light-emitting device according to the invention, the ZnSSe compound semiconductor layer is provided only between the compound semiconductor substrate and the first cladding layer.

For the reason of ensuring a sufficiently low resistance while ensuring good optical confinement characteristics and carrier confinement characteristics and for other reasons, the ZnSSe compound semiconductor layer is preferably 0.01~2 µm thick, and the first cladding layer is 0.2~2 µm thick. In this case, the total thickness of the first cladding layer and the ZnSSe compound semiconductor layer is preferably chosen to be 0.4 µm or more.

In a further preferable working form of the semiconductor light-emitting device according to the invention, the ZnSSe compound semiconductor layers are provided both on the second cladding layer and between the compound semiconductor substrate and the first cladding layer.

For the reason of ensuring a sufficiently low resistance while ensuring good optical confinement characteristics and carrier confinement characteristics and for other reasons, the ZnSSe compound semiconductor layer between the compound semiconductor substrate and the first cladding layer is preferably 0.01~2 µm, the ZnSSe compound semiconductor layer on the second cladding layer is preferably 0.1~2 µm thick, the first cladding layer is preferably 0.2~2 µm thick, and the second cladding layer is preferably 0.2~2 µm thick. In this case, the total thickness of the first cladding layer and the ZnSSe compound semiconductor layer between the compound semiconductor substrate and the first cladding layer is preferably chosen to be 0.4 µm or more, and the total thickness of the second cladding layer and the ZnSSe compound semiconductor layer on the second cladding layer is also preferably chosen to be 0.4 µm or more.

In the foregoing working forms of the semiconductor light-emitting device according to the invention, impurity concentrations of the first cladding layer and the second cladding layer are preferably chosen in the range of $5 \times 10^{16}$ to $1 \times 10^{18} cm^{-3}$ in terms of $|N_A - N_D|$ ($N_A$ is the acceptor concentration and $N_D$ is the donor concentration), and impurity concentrations of the ZnSSe compound semiconductor layers are chosen in the range of $1 \times 10^{17}$ to $2 \times 10^{18} cm^{-3}$ in terms of $|N_A - N_D|$, for the purpose of ensuring their sufficiently low resistances.

When the second cladding layer and the ZnSSe compound semiconductor are of p-type in the semiconductor light-emitting device according to the invention, a p-type contact layer made of a ZnSe compound semiconductor is preferably stacked on the ZnSSe compound semiconductor layer.

The p-type contact layer is preferably 30~150 nm thick. The impurity concentration of the p-type contact layer is preferably chosen in the range of $5 \times 10^{17}$ to $5 \times 10^{18} cm^{-3}$ in terms of $|N_A - N_D|$, for the purpose of ensuring its sufficiently low resistance.

In the semiconductor light-emitting device according to the invention, the active layer is made of, for example, a ZnCdSe compound semiconductor. In this case, the wavelength of oscillation of the semiconductor light-emitting device ranges from green to blue wavelengths, depending on the composition of the ZnCdSe compound semiconductor.

A GaAs-substrate is preferably used as the compound semiconductor substrate.

Since the ZnSSe compound semiconductor is provided on the second cladding layer and/or between the compound semiconductor substrate and the first cladding layer in the semiconductor light-emitting device according to the invention, for example, the ZnSSe compound semiconductor layer provided on the second cladding layer can be also used as a cladding layer of the second conduction type so as to minimize the thickness of the second cladding layer made of a ZnMgSSe compound semiconductor whose epitaxial growth is not so easy as a binary or ternary II–V compound semiconductor, thereby so much facilitating fabrication of the semiconductor light-emitting device. If the thickness of the entirety of the second conduction type cladding layer is identical, the resistance of the second conduction type cladding layer can be made lower in the arrangement in which the second conduction type cladding layer is made of the second cladding layer of a ZnMgSSe compound semiconductor and the ZnSSe compound semiconductor than in the arrangement in which the second conduction type cladding layer consists of the second cladding layer alone. As a consequence, generation of heat during operation of the semiconductor light-emitting device can be suppressed. Moreover, good optical confinement characteristics and carrier confinement characteristics are ensured.

As to stacking the p-type contact layer made of a ZnSe compound semiconductor on an upper side of the second cladding layer made of a ZnMgSSe compound semiconductor, better crystal qualities are obtained by the arrangement in which the p-type contact layer is stacked above the second cladding layer via the ZnSSe compound semiconductor layer whose lattice constant substantially coincides with that of the second cladding layer than the arrangement in which the p-type contact layer is directly stacked on the second cladding layer.

The properties mentioned above provide a semiconductor light-emitting device using a ZnMgSSe compound semiconductor as the material of the cladding layer and capable of emitting blue to green light, which is excellent in optical confinement characteristics and carrier confinement characteristics, generates only a small amount of heat during operation, and is easily fabricated.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Embodiments of the invention are described below with reference to the drawings. In all the drawings of embodiments, identical or corresponding elements are labelled with the same reference numerals.

Figure 1:
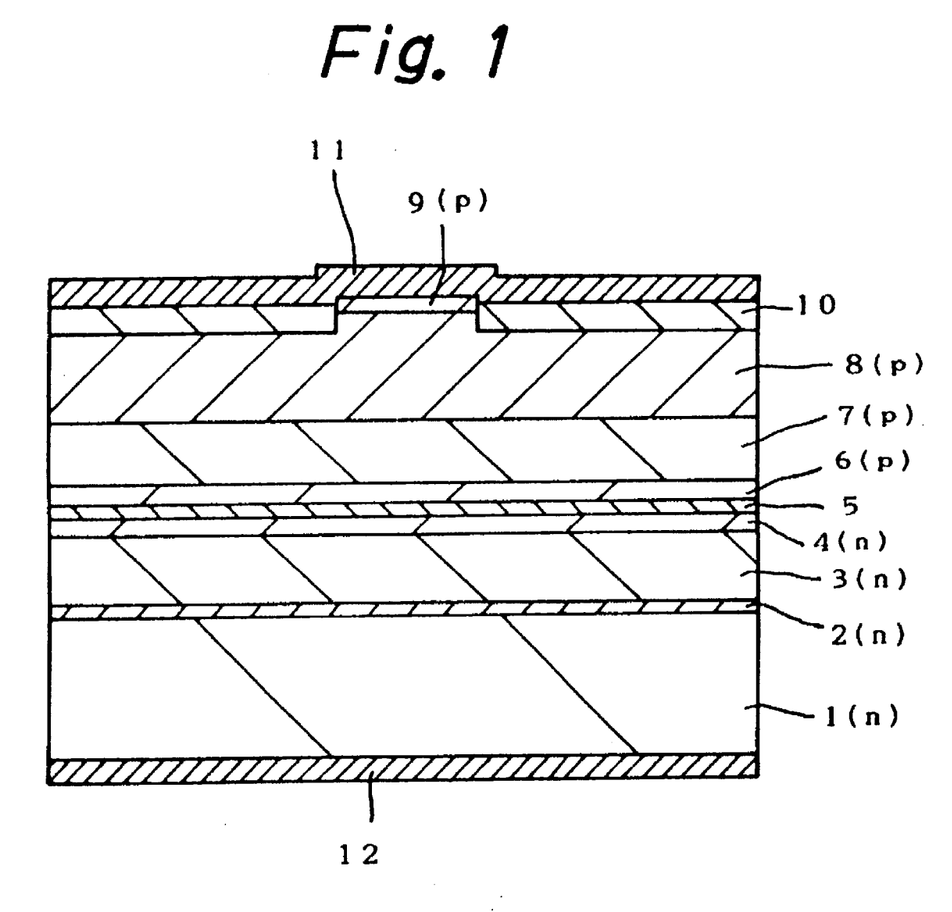
FIG. 1 is a cross-sectional view of a semiconductor laser according to a first embodiment of the invention.

FIG. 1 shows a semiconductor laser according to a first embodiment of the invention. The semiconductor laser according to the first embodiment has an SCH (separated confinement heterostructure) structure.

As shown in FIG. 1, the semiconductor laser according to the first embodiment uses an n-type GaAs substrate 1 having the (100) orientation and doped with Si, for example, as an n-type impurity. Sequentially stacked on the n-type GaAs substrate 1 are an n-type ZnSe buffer layer 2 doped with, for example, Cl as an n-type impurity; an n-type $Zn_{1-p}Mg_pS_qSe_{1-q}$ cladding layer 3 doped with, for example, Cl as an n-type impurity; an n-type ZnSe optical waveguide layer 4 doped with, for example, Cl as an n-type impurity; an active layer 5; a p-type ZnSe optical waveguide layer 6 doped with, for example, N as a p-type impurity; a p-type $Zn_{1-p}Mg_pS_qSe_{1-q}$ cladding layer 7 doped with, for example, N as a p-type impurity; a p-type $ZnS_vSe_{1-v}$ layer 8 doped with, for example, N as a p-type impurity; and a p-type ZnSe contact layer 9 doped with, for example, N as a p-type impurity.

In this case, the p-type ZnSe contact layer 9 and an upper portion of the p-type $ZnS_vSe_{1-v}$ layer 8 are patterned in the form of stripes. The width of each stripe portion is, for example, 5 μm.

Further provided on the p-type $ZnS_vSe_{1-v}$ except the stripe portions is an insulating layer 10 in the form of, for example, a 300 nm thick alumina ($Al_2O_3$) film. Formed on the stripe-shaped p-type ZnSe contact layer 9 and on the insulating layer 10 is a p-side electrode 11. The portion where the p-side electrode 11 contacts the p-type ZnSe contact layer 9 behaves as a flow path of the electric current. The p-side electrode 11 may be made, for example, as an Au/Pt/Pd electrode made by sequentially stacking a 10 nm thick Pd film, a 100 nm thick Pt film and a 300 nm thick Au film. On the other hand, an n-side electrode such as In electrode contacts the back surface of the n-type GaAs substrate 1.

Figure 2:
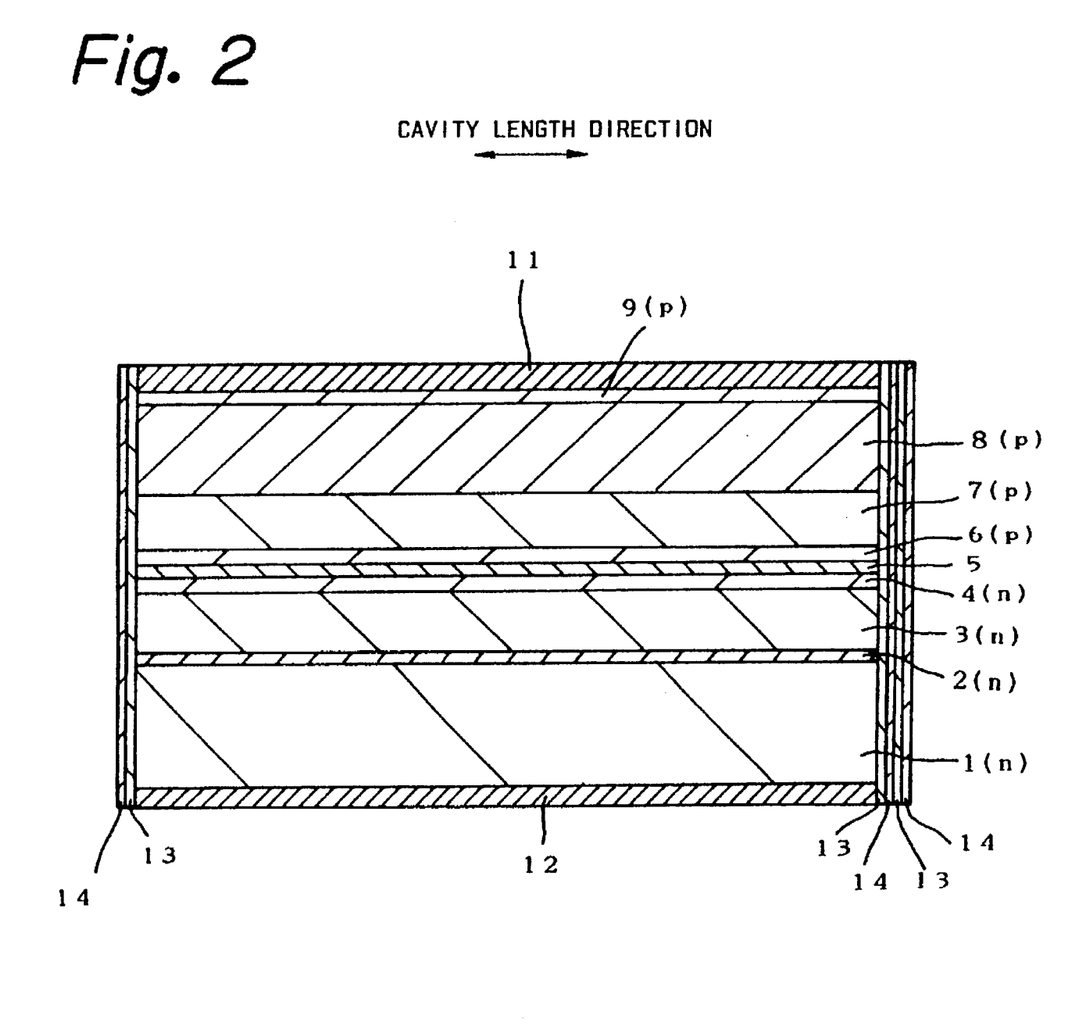
FIG. 2 is a cross-sectional view showing the semiconductor laser according to the first embodiment of the invention.

The semiconductor laser according to the first embodiment is end-coated. More specifically, FIG. 2 is a cross-sectional view taken along a plane parallel to the cavity length direction of the semiconductor laser according to the first embodiment. As shown in FIG. 2, the front one of a pair of cavity end surfaces vertical to the cavity length direction, from which a laser beam is taken out, is coated with a multi-layered film composed of a 74 nm thick $Al_2O_3$ film 13 and a 31 nm thick Si film 14, and the rear one of the pair of cavity end surfaces vertical to the cavity length direction, from which a laser beam is not taken out, is coated with a multi-layered film made by stacking two sets of 74 nm thick $Al_2O_3$ films 13 and 31 nm thick Si films 14. The thickness of the multi-layered film composed of the $Al_2O_3$ film 13 and the Si film 14 is chosen such that the optical distance obtained by multiplying it by its refractive index equals ¼ of the wavelength of oscillation of a laser beam. In this case, the reflectivity of the front end surface is 70%, and the reflectivity of the rear end surface is 95%.

In the first embodiment, the active layer 5 is preferably 2~20 nm thick, and has a single quantum well structure including an i-type $Zn_{1-z}Cd_zSe$ quantum well layer having the thickness of, for example, 9 nm. In this case, the n-type ZnSe optical waveguide layer 4 and the p-type ZnSe optical waveguide layer 6 behave as barrier layers.

The Mg composition ratio p of the n-type $Zn_{1-p}Mg_pS_qSe_{1-q}$ cladding layer 3 and the p-type $Zn_{1-p}Mg_pS_qSe_{1-q}$ cladding layer 7 is, for example, 0.09, the S composition ratio q thereof is, for example, 0.18, and their band gaps $E_g$ are about 2.94 eV at 77K. The n-type $Zn_{1-p}Mg_pS_qSe_{1-q}$ cladding layer 3 and the p-type $Zn_{1-p}Mg_pS_qSe_{1-q}$ cladding layer 7 having the Mg composition ratio p=0.09 and the S composition ratio q=0.18 are in lattice matching with GaAs. The Cd composition ratio z of the i-type $Zn_{1-z}Cd_zSe$ quantum well layer of the active layer 5 is, for example, 0.19, and the band gap $E_g$ is about 2.54 eV at 77K. In this case, the difference $\Delta E_g$ between the band gaps $E_g$ of the n-type $Zn_{1-p}Mg_pS_qSe_{1-q}$ cladding layer 3 and the p-type $Zn_{1-p}Mg_pS_qSe_{1-q}$ cladding layer 7 and the band gap $E_g$ of the i-type $Zn_{1-z}Cd_zSe$ quantum well layer forming the active layer 5 is 0.40 eV. Values of band gaps $E_g$ at room temperature can be obtained by subtracting 0.1 eV from the values of the band gaps $E_g$ at 77K.

In this case, the thickness of the n-type $Zn_{1-p}Mg_pS_qSe_{1-q}$ cladding layer 3 is, for example, 1.5 μm thick, and has the impurity concentration of, for example, $5 \times 10^{17} cm^{-3}$ in terms of $N_D-N_A$. The n-type ZnSe waveguide layer 4 is, for example, 80 nm thick, and has the impurity concentration of, for example, $5 \times 10^{17} cm^{-3}$ in terms of $N_D-N_A$. The p-type ZnSe waveguide layer 6 is, for example, 80 nm thick, and has the impurity concentration of, for example, $5 \times 10^{17} cm^{-3}$ in terms of $N_A-N_D$. The p-type $Zn_{1-p}Mg_pS_qSe_{1-q}$ cladding layer 7 is, for example, 0.8 μm thick, and has the impurity concentration of, for example, $2 \times 10^{17} cm^{-3}$ in terms of $N_A-N_D$. The p-type $ZnS_vSe_{1-v}$ layer 8 is, for example, 0.8 μm thick, and has the impurity concentration of, for example, $8 \times 10^{17} cm^{-3}$ in terms of $N_A-N_D$. The p-type ZnSe contact layer 9 is, for example, 45 nm thick, and has the impurity concentration of $8 \times 10^{17} cm^{-3}$ in terms of $N_A-N_D$.

Since small lattice mismatching exists between ZnSe and GaAs, dislocation may occur due to the lattice mismatching during epitaxial growth of the n-type ZnSe buffer layer 2 and other layers thereon. To prevent this, the thickness of the n-type ZnSe buffer layer 2 is chosen to be sufficiently smaller than the critical thickness of ZnSe (~100 nm), that is, for example, 33 nm in the first embodiment.

The cavity length L of the semiconductor laser according to the first embodiment is chosen to be, for example, 640 μm, and the width in the direction vertical to the cavity length direction is chosen to be, for example, 400 μm.

In the first embodiment, the p-type $ZnS_vSe_{1-v}$ layer 8 stacked on the p-type $Zn_{1-p}Mg_pS_qSe_{1-q}$ layer 7 has one or more functions, depending on cases, among the function as the second p-type cladding layer added to the p-type $Zn_{1-p}Mg_pS_qSe_{1-q}$ cladding layer 7, the function of providing lattice matching with the p-type $Zn_{1-p}Mg_pS_qSe_{1-q}$ cladding layer 7, the function as a spacer layer for preventing a short circuit caused by a solder creeping up along the chip end surfaces when a laser chip is mounted on a heat sink, as will be described later, and other functions. Although the Mg composition ratio P and the S composition ratio q of the p-type $Zn_{1-p}Mg_pS_qSe_{1-q}$ cladding layer 7 must be taken into consideration, the S composition ratio v of the p-type $ZnS_vSe_{1-v}$ layer 8 is chosen in the range of $0 < v \leq 0.1$ and preferably $0.06 \leq v \leq 0.08$, and the optimum S composition ratio v for lattice matching with the p-type $Zn_{1-p}Mg_pS_qSe_{1-q}$ cladding layer 7 is 0.06.

Stacking the p-type $ZnS_vSe_{1-v}$ layer 8 on the p-type $Zn_{1-p}Mg_pS_qSe_{1-q}$ cladding layer 7 provides the following various advantages. That is, when the p-type $ZnS_vSe_{1-v}$ layer 8 is used as the second p-type cladding layer, it is possible to minimize the thickness of the p-type $Zn_{1-p}Mg_pS_qSe_{1-q}$ cladding layer 7 whose epitaxial growth is not so easy as a binary or ternary II–VI compound semiconductor, thereby so much facilitating fabrication of the semiconductor laser. Further, if the thickness of the entire p-type cladding layer is identical, the resistance of the p-type cladding layer can be made lower in the arrangement in which the p-type cladding layer is composed of the p-type $Zn_{1-p}Mg_pS_qSe_{1-q}$ cladding layer 7 and the p-type $ZnS_vSe_{1-v}$ layer 8 than in the arrangement in which the p-type cladding layer consists of the p-type $Zn_{1-p}Mg_pS_qSe_{1-q}$ cladding layer 7 alone. In particular, when the p-type $Zn_{1-p}Mg_pS_qSe_{1-q}$ cladding layer 7 having the thickness of about 0.8 μm and $N_A-N_D$ of about $2 \times 10^{17} cm^{-3}$ and the p-type $ZnS_vSe_{1-v}$ layer 8 having the thickness of about 0.8 μm and $N_A-N_D$ of about $8 \times 10^{17} cm^{-3}$, the resistance of the entire p-type cladding layer can be made sufficiently low without deteriorating the optical confinement characteristics and the carrier confinement characteristics.

If the p-type ZnSe contact layer 9 is directly stacked on the p-type $Zn_{1-p}Mg_pS_qSe_{1-q}$ cladding layer 7, the crystal quality would be deteriorated due to lattice mismatching between these layers. In the first embodiment, however, since the p-type $ZnS_vSe_{1-v}$ layer 8 having substantially the same lattice constant as that of the p-type $Zn_{1-p}Mg_pS_qSe_{1-q}$ cladding layer 7 is stacked on the p-type $Zn_{1-p}Mg_pS_qSe_{1-q}$ cladding layer 7 and the p-type ZnSe contact layer 9 is stacked on the p-type $ZnS_vSe_{1-v}$ layer 8, good crystal qualities of the p-type $ZnS_vSe_{1-v}$ layer 8 and the p-type ZnSe contact layer 9 can be realized.

Figure 3:
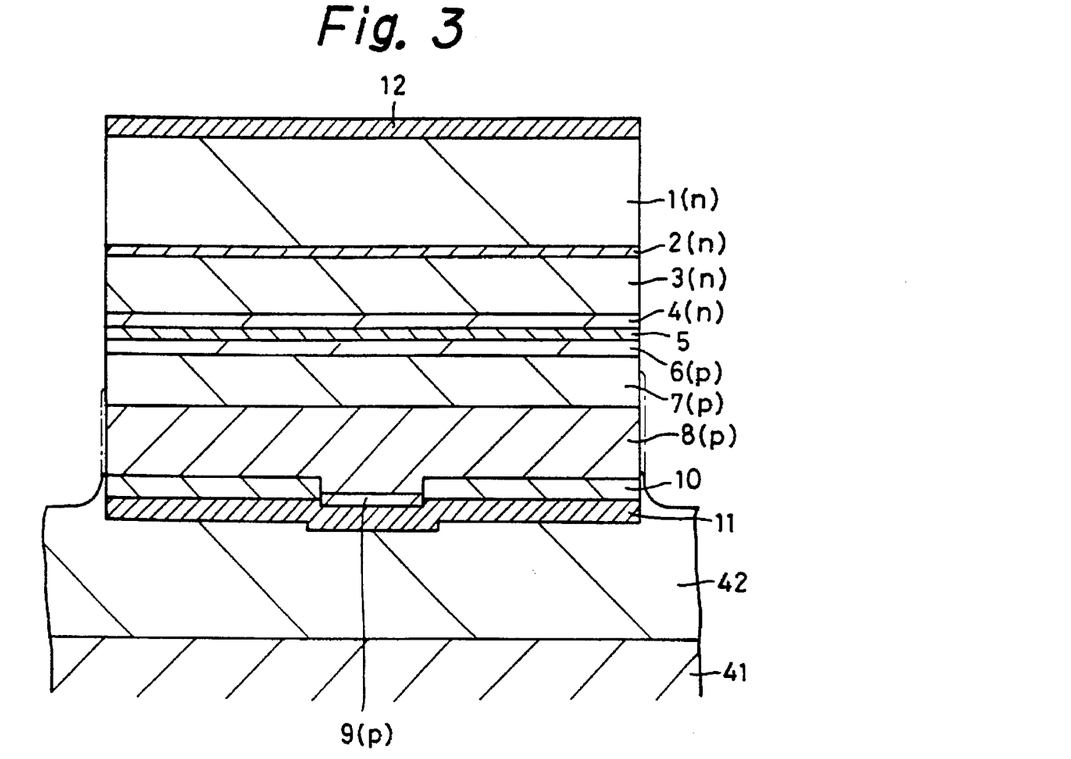
FIG. 3 is a cross-sectional view showing the semiconductor laser according to the first embodiment of the invention mounted on a heat sink.

Additionally, by providing the p-type $ZnS_vSe_{1-v}$ layer 8 with a sufficient thickness, it can be effectively prevented that a solder used to mount a laser chip on a heat sink creeps up along the end surfaces of the laser chip and makes a short circuit between the p-side and the n-side. More specifically, as shown in FIG. 3, when a laser chip is mounted on a heat sink 41 in p-side down by orienting the p-side electrode 11 downward, no problem would arise if the solder 42 remains only between the laser chip and the heat sink 41 as shown by the solid line. Even if the solder creeps up, for example, in the form of lines, along the end surfaces of the laser chip as shown by the dash-and-dot lines because of a somewhat rough soldering, a sufficiently large thickness of the p-type $ZnS_vSe_{1-v}$ layer 8 can prevent the solder 42 from creeping up along the end surfaces of the laser chip and reaching the n-type ZnSe optical waveguide layer 4 and the n-type $Zn_{1-p}Mg_pS_qSe_{1-q}$ cladding layer 3 beyond the active layer 5. Typically, the creeping-up of the solder 42 can be terminated far below the active layer 5. As a result, the embodiment can prevent short circuiting of the p-side and the n-side of the laser chip during the mounting thereof, and thereby facilitating the mounting of the laser chip.

Next explained is a method of fabricating the semiconductor laser according to the first embodiment.

Figure 4:
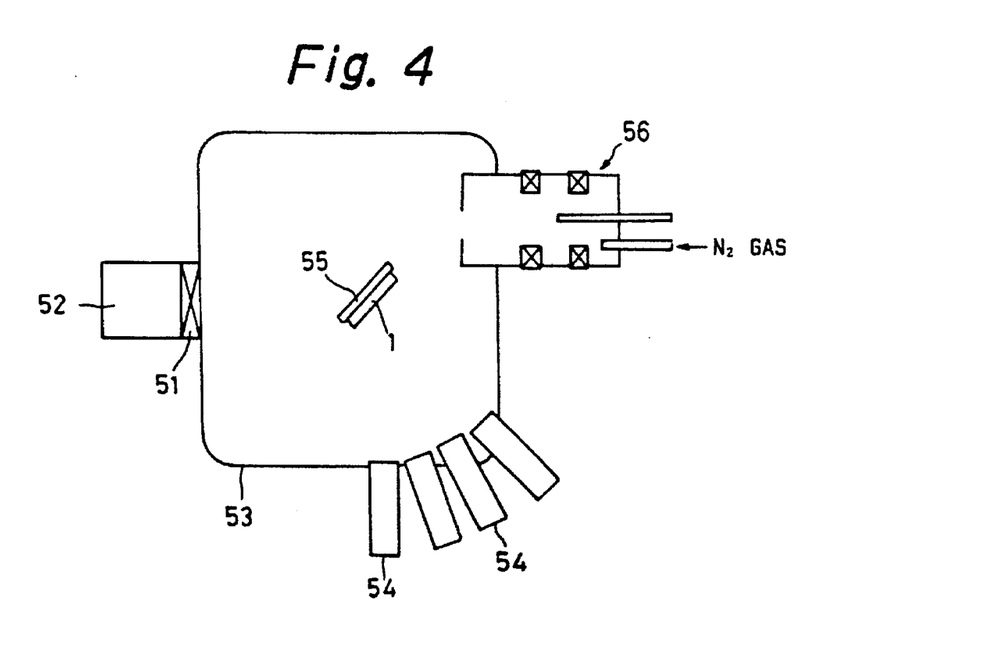
FIG. 4 is a schematic view showing a MBE apparatus used for fabricating the semiconductor laser according to the first embodiment of the invention.

FIG. 4 shows a molecular beam epitaxy (MBE) apparatus used in the method of fabricating the semiconductor laser according to the first embodiment for epitaxially growing respective layers constituting the laser structure. As shown in FIG. 4, the MBE apparatus includes a plurality of molecular beam sources (K cells) 54, a substrate holder 55 for holding a substrate for epitaxial growth thereon, and an electron cyclotron resonance (ECR) plasma cell 56 which are contained in a vacuum container 53 which can be evacuated into ultrahigh vacuum by an ultrahigh vacuum evacuating apparatus 52 connected thereto via a gate valve 51.

To fabricate the semiconductor laser according to the first embodiment, an n-type GaAs substrate 1 is first set on a substrate holder 55 in the vacuum container 53 of the MBE apparatus shown in FIG. 4. The n-type GaAs substrate 1 is then heated to a temperature sufficiently higher than the growth temperature, for example, to 580° C., for cleaning the surface. After that, the temperature of the n-type GaAs substrate 1 is decreased to a predetermined epitaxial growth temperature, preferably in the range of 250°~300° C., more preferably in the range of 280°~300° C. specifically to 295° C., to start the epitaxial growth. That is, by using the MBE method, epitaxially grown in sequence on the n-type GaAs substrate 1 are the n-type ZnSe buffer layer 2, the n-type $Zn_{1-p}Mg_pS_qSe_{1-q}$ cladding layer 3, the n-type ZnSe optical waveguide layer 4, the active layer 5 composed of the i-type $Zn_{1-z}Cd_zSe$ quantum well layer, the p-type ZnSe optical waveguide layer 6, the p-type $Zn_{1-p}Mg_pS_qSe_{1-q}$ cladding layer 7, the p-type $ZnS_vSe_{1-v}$ layer 8, and the p-type ZnSe contact layer 9. In this case, it is possible to epitaxially grow these layers with good crystal qualities, to hence suppress deteriorations such as a decrease in light output of the semiconductor laser and to obtain a high reliability.

The epitaxial growth by the MBE method uses Zn having the purity of 99.9999% as the source of Zn, Mg having the purity of 99.9% as the source of Mg, ZnS having the purity of 99.9999% as the source of S, and Se having the purity of 99.9999% as the source of Se. Further, doping of Cl as the n-type impurity of n-type ZnSe buffer layer 2, n-type $Zn_{1-p}Mg_pS_qSe_{1-q}$ cladding layer 3 and n-type ZnSe optical waveguide layer 4 is done by using, for example, $ZnCl_2$ having the purity of 99.9999% as the dopant. On the other hand, doping of N as the p-type impurity of the p-type ZnSe optical waveguide layer 6, p-type $Zn_{1-p}Mg_pS_qSe_{1-q}$ cladding layer 7 and p-type ZnSe contact layer 9 is done by irradiating $N_2$ plasma generated by ECR, for example.

After that, a stripe-shaped resist pattern (not shown) with a predetermined width is formed on the p-type ZnSe contact layer 9, and the p-type $ZnS_vSe_{1-v}$ layer 8 is etched up to an intermediate portion in its thickness direction by a wet etching method using the resist pattern as a mask. As a result, the p-type ZnSe contact layer 9 and an upper portion of the p-type $ZnS_vSe_{1-v}$ layer 8 are patterned into stripes.

After that, while maintaining the resist pattern used by the etching, an $Al_2O_3$ film is deposited on the entire surface by vacuum evaporation. Thereafter, the resist pattern and the $Al_2O_3$ film thereon are removed (lift-off). As a result, an insulating layer 10 composed of the $Al_2O_3$ film is formed only on the p-type $ZnS_vSe_{1-v}$ layer 8 in the areas other than the stripe portions.

Next formed on the entire surface including the stripe-shaped p-type ZnSe contact layer 9 and the insulating layer 10 is the p-side electrode 11 composed of an Au/Pt/Pd electrode made by sequentially depositing Pd, Pt and Au films by vacuum evaporation. Then, after annealing, if necessary, the p-side electrode 11 is brought into ohmic contact with the p-type ZnSe contact layer 9. Formed on the back surface of the n-type GaAs substrate 1 is the n-side electrode 12 such as In electrode.

After that, the n-type GaAs substrate 1 provided with the laser structure thereon is cleaved into bars having the width of 640 μm, for example, to thereby make cavity end surfaces. After that, by vacuum evaporation, a multi-layered film composed of an $Al_2O_3$ film 13 and a Si film 14 is formed on the front end surface, and a multi-layered film composed of two sets of $Al_2O_3$ films 13 and Si films 14 is formed on the rear end surface. After such end coating, the bar is cleaved into chips having the width of 400 μm, and the chips are packaged.

Figure 5:
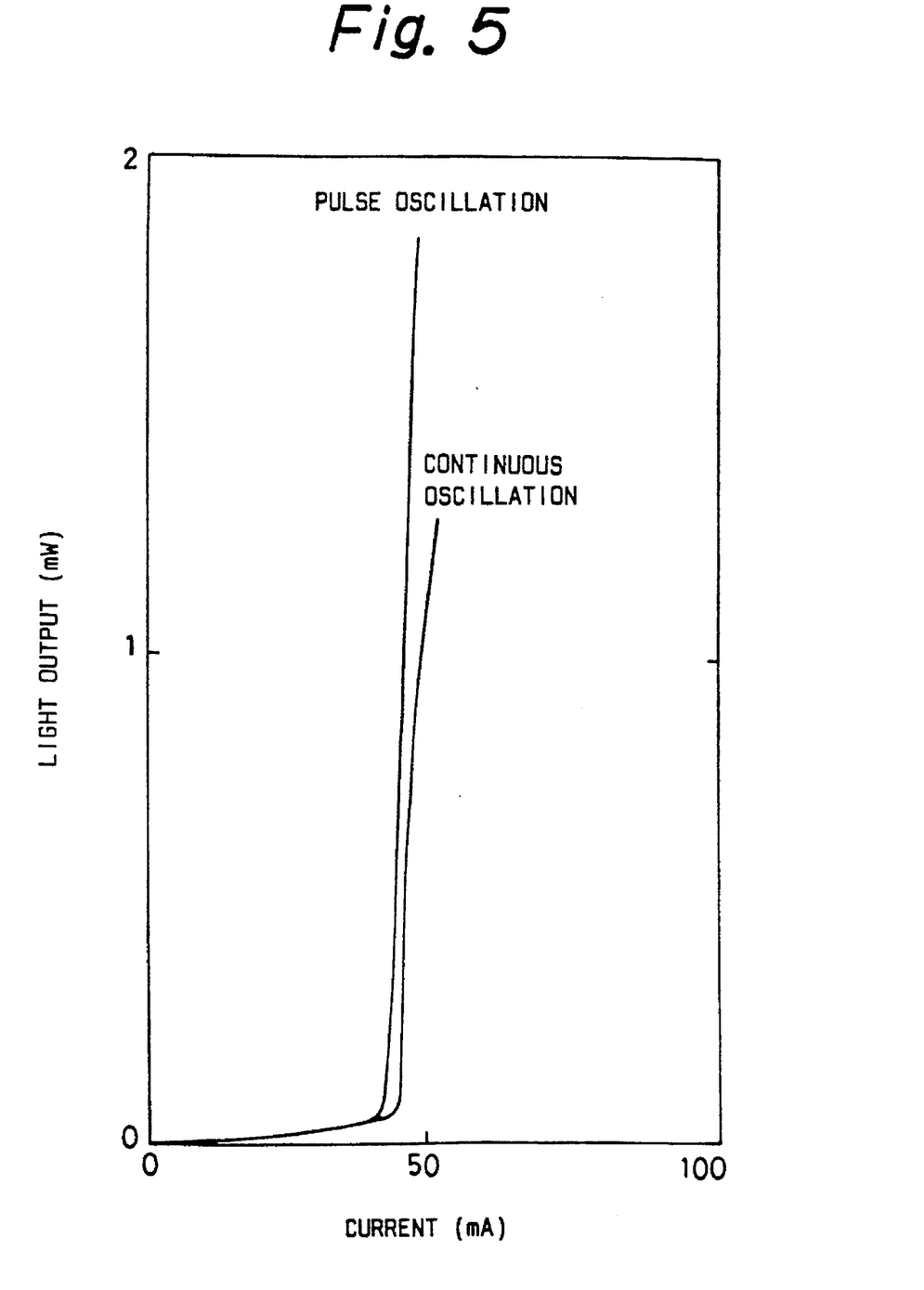
FIG. 5 is a graph showing a result of measurement of characteristics of the semiconductor laser according to the first embodiment of the invention in terms of the light output versus the current at room temperature.

FIG. 5 shows a result of measurement of characteristics, in terms of the light output versus the current, which was conducted with the semiconductor laser according to the first embodiment at room temperature (296K) by applying a continuous flow of the injected current and by applying a pulsating flow of the injected current. The measurement was conducted by mounting the laser chip in p-side down on the heat sink 41 of copper as shown in FIG. 3. As apparent from FIG. 5, the threshold current $I_{th}$ with a continuous flow of the injected current is about 45 mA which corresponds to the threshold current density $J_{th}$ of about 1.5 kA/cm². On the other hand, the threshold current $I_{th}$ with a pulsating flow of the injected current is about 42 mA. Note that the measurement of the characteristics in terms of the light output versus the current with a continuous flow of the injected current was conducted by increasing the injected current from 0 to 100 mA at the rate of 500 mA/second. On the other hand the measurement of the characteristics in terms of the light output versus the current with a pulsating flow of the injected current was conducted by applying the injected current with the pulse width of 2 μs at intervals of 1 ms. As apparent from FIG. 5, the slope efficiencies $S_d$ with the pulsating flow of the injected current and with the continuous flow of the injected current are 0.34 W/A and 0.31 W/A, respectively. The applied voltage between the p-side electrode 11 and the n-side electrode 12 at the threshold value of the laser oscillation is about 17 V.

Figure 6:
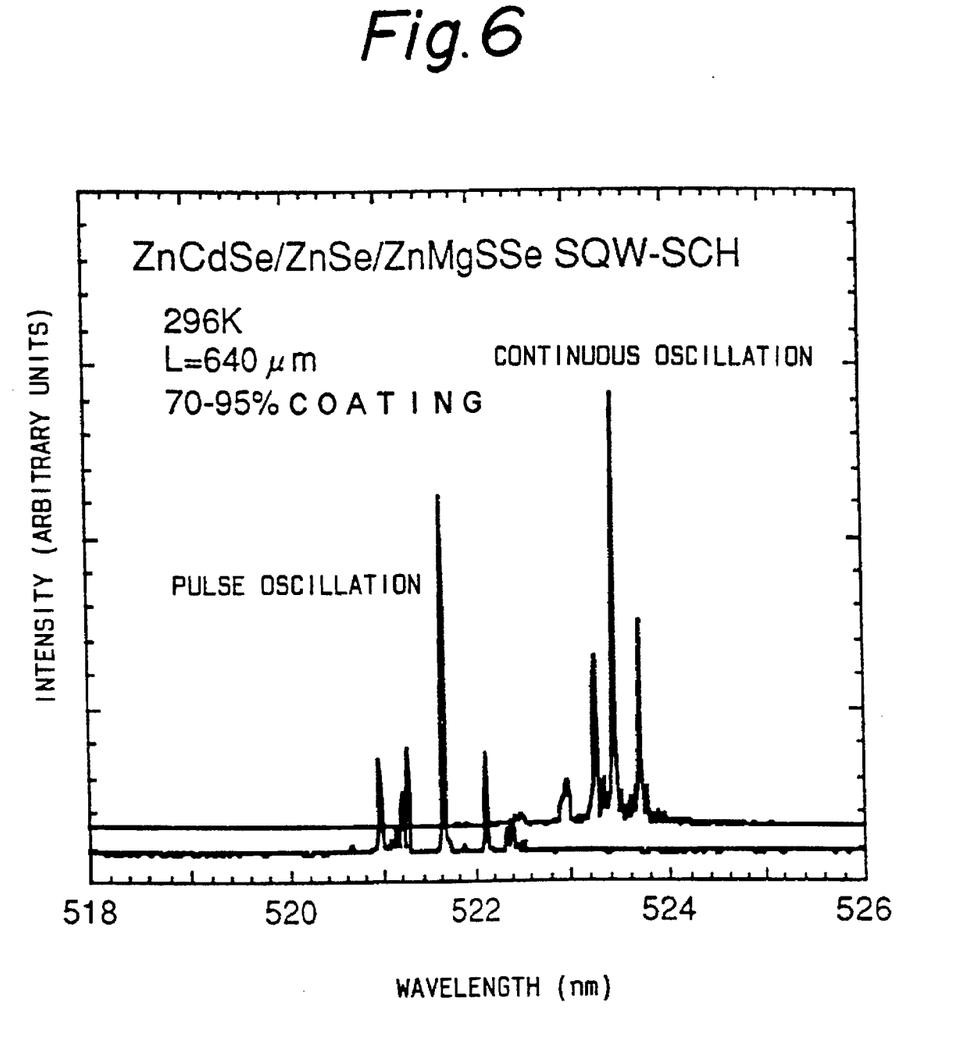
FIG. 6 is a graph showing a result of measurement of the light emission spectrum at room temperature by the semiconductor laser according to the first embodiment of the invention.

FIG. 6 shows a result of measurement of the spectrum of light emitted from the semiconductor laser according to the first embodiment oscillated at room temperature (296K). As apparent from FIG. 6, induced emissions with wavelengths of 521.6 nm and 523.5 nm are observed by a pulse operation and by a continuous operation, respectively.

As apparent from the foregoing description, the first embodiment can realize a semiconductor laser capable of emitting green light by continuous oscillation with the wavelength of 523.5 nm at room temperature and having the SCH structure with a low threshold current density. This semiconductor laser generates only a small amount of heat during operation, and can be fabricated easily.

When the Cd composition ratio z of the i-type $Zn_{1-z}Cd_zSe$ quantum well layer constituting the active layer 5 is 0.05, the band gap $E_g$ is 2.72 eV at 77K. When the Mg composition ratio p and the S composition ratio q of the n-type $Zn_{1-p}Mg_pS_qSe_{1-q}$ cladding layer 3 and the p-type $Zn_{1-p}Mg_pS_qSe_{1-q}$ cladding layer 7 are 0.17 and 0.24, respectively, the band gap $E_g$ is 3.07 eV at 77K. Then, the difference $\Delta E_g$ between the band gap $E_g$ of the n-type $Zn_{1-p}Mg_pS_qSe_{1-q}$ cladding layer 3 and the p-type $Zn_{1-p}Mg_pS_qSe_{1-q}$ cladding layer 7 and the band gap $E_g$ of the i-type $Zn_{1-z}Cd_zSe$ quantum well layer constituting the active layer 5 is 0.35 eV. In this case, the wavelength of oscillation is about 473 nm.

When the Cd composition ratio z of the i-type $Zn_{1-z}Cd_zSe$ quantum well layer constituting the active layer 5 is 0.10, the band gap $E_g$ is 2.65 eV at 77K. When the Mg composition ratio p and the S composition ratio q of the n-type $Zn_{1-p}Mg_pS_qSe_{1-q}$ cladding layer 3 and the p-type $Zn_{1-p}Mg_pS_qSe_{1-q}$ cladding layer 7 are 0.13 and 0.21, respectively, the band gap $E_g$ is 3.00 eV at 77K. Then, the difference $\Delta E_g$ between the band gap $E_g$ of the n-type $Zn_{1-p}Mg_pS_qSe_{1-q}$ cladding layer 3 and the p-type $Zn_{1-p}Mg_pS_qSe_{1-q}$ cladding layer 7 and the band gap $E_g$ of the i-type $Zn_{1-z}Cd_zSe$ quantum well layer constituting the active layer 5 is 0.35 eV. In this case, the wavelength of oscillation is about 486 nm.

When the Cd composition ratio z of the i-type $Zn_{1-z}Cd_zSe$ quantum well layer constituting the active layer 5 is 0.12, the band gap $E_g$ is 2.62 eV at 77K. When the Mg composition ratio p and the S composition ratio q of the n-type $Zn_{1-p}Mg_pS_qSe_{1-q}$ cladding layer 3 and the p-type $Zn_{1-p}Mg_pS_qSe_{1-q}$ cladding layer 7 are 0.10 and 0.17, respectively, the band gap $E_g$ is 2.97 eV at 77K. Then, the difference $\Delta E_g$ between the band gap $E_g$ of the n-type $Zn_{1-p}Mg_pS_qSe_{1-q}$ cladding layer 3 and the p-type $Zn_{1-p}Mg_pS_qSe_{1-q}$ cladding layer 7 and the band gap $E_g$ of the i-type $Zn_{1-z}Cd_zSe$ quantum well layer constituting the active layer 5 is 0.35 eV. In this case, the wavelength of oscillation is about 491 nm.

When the Cd composition ratio z of the i-type $Zn_{1-z}Cd_zSe$ quantum well layer constituting the active layer 5 is 0.20, the band gap $E_g$ is 2.51 eV at 77K. When the Mg composition ratio p and the S composition ratio q of the n-type $Zn_{1-p}Mg_pS_qSe_{1-q}$ cladding layer 3 and the p-type $Zn_{1-p}Mg_pS_qSe_{1-q}$ cladding layer 7 are 0.03 and 0.08, respectively, the band gap $E_g$ is 2.86 eV at 77K. Then, the difference $\Delta E_g$ between the band gap $E_g$ of the n-type $Zn_{1-p}Mg_pS_qSe_{1-q}$ cladding layer 3 and the p-type $Zn_{1-p}Mg_pS_qSe_{1-q}$ cladding layer 7 and the band gap $E_g$ of the i-type $Zn_{1-z}Cd_zSe$ quantum well layer constituting the active layer 5 is 0.35 eV. In this case, the wavelength of oscillation is about 514 nm.

Figure 7:
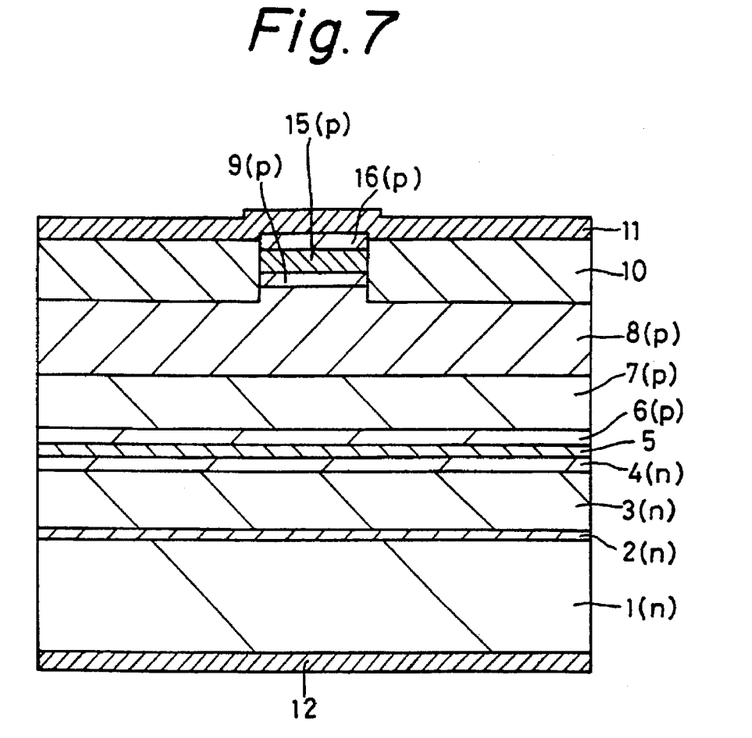
FIG. 7 is a cross-sectional view showing a semiconductor laser according to a second embodiment of the invention.

FIG. 7 shows a semiconductor laser according to a second embodiment of the invention. The semiconductor laser according to the second embodiment also has a SCH structure.

As shown in FIG. 7, the semiconductor laser according to the second embodiment uses an n-type GaAs substrate 1 having the (100) orientation and doped with Si, for example, as an n-type impurity. Sequentially stacked on the n-type GaAs substrate 1 are an n-type ZnSe buffer layer 2 doped with, for example, Cl as an n-type impurity; an n-type $Zn_{1-p}Mg_pS_qSe_{1-q}$ cladding layer 3 doped with, for example, Cl as an n-type impurity; an n-type ZnSe optical waveguide layer 4 doped with, for example, Cl as an n-type impurity; an active layer 5; a p-type ZnSe optical waveguide layer 6 doped with, for example, N as a p-type impurity; a p-type $Zn_{1-p}Mg_pS_qSe_{1-q}$ cladding layer 7 doped with, for example, N as a p-type impurity; a p-type $ZnS_ySe_{1-y}$ layer 8 doped with, for example, N as a p-type impurity; a p-type ZnSe contact layer 9 doped with, for example, N as a p-type impurity; a p-type ZnTe/ZnSe multiquantum well (MQW) layer 15 composed of p-type ZnTe quantum well layers and p-type ZnSe barrier layers stacked alternately; and a p-type ZnTe contact layer 16 doped with, for example, N as a p-type impurity. The p-type ZnTe/ZnSe MQW layer 15 will be described later in greater detail.

In this case, the p-type ZnTe contact layer 16, p-type ZnTe/ZnSe MQW layer 15, the p-type ZnSe contact layer 9 and an upper portion of the p-type $ZnS_ySe_{1-y}$ layer 8 are patterned in the form of stripes. The width of each stripe portion is, for example, 5 μm.

The second embodiment is the same as the first embodiment in that an insulating layer 10 in the form of an alumina ($Al_2O_3$) film on the p-type $ZnS_ySe_{1-y}$ layer 8 except the stripe portions. In this case, the p-side electrode 11 is formed on the stripe-shaped p-type ZnTe contact layer 16 and on the insulating layer 10. An Au/Pt/Pd electrode, for example, may be used as the p-side electrode 11 like in the first embodiment. The second embodiment is also the same as the first embodiment in that the n-side electrode 12 such as an In electrode contacts the rear surface of the n-type GaAs substrate 1.

The semiconductor laser according to the second embodiment is also end-coated, although not shown, like the semiconductor laser according to the first embodiment.

In the second embodiment, the active layer 5 is preferably 2~20 nm thick, and has a single quantum well structure including an i-type $Zn_{1-z}Cd_zSe$ quantum well layer having the thickness of, for example, 9 nm. In this case, the n-type ZnSe optical waveguide layer 4 and the p-type ZnSe optical waveguide layer 6 behave as barrier layers, like in the first embodiment.

The second embodiment is the same as the first embodiment in the Mg and S composition ratios p and q of the n-type $Zn_{1-p}Mg_pS_qSe_{1-q}$ cladding layer 3 and the p-type $Zn_{1-p}Mg_pS_qSe_{1-q}$ cladding layer 7 and the Cd composition ratio Z of the i-type $Zn_{1-z}Cd_zSe$ quantum well layer constituting the active layer 5. The second embodiment is also the same as the first embodiment in thickness and impurity concentrations of the n-type $Zn_{1-p}Mg_pS_qSe_{1-q}$ cladding layer 3, the n-type ZnSe optical waveguide layer 4, p-type ZnSe optical waveguide layer 6, p-type $Zn_{1-p}Mg_pS_qSe_{1-q}$ cladding layer 7, p-type $ZnS_ySe_{1-y}$ layer 8 and p-type ZnSe contact layer 9. The thickness of the p-type ZnTe contact layer 16 is, for example, 70 nm, and its impurity concentration is, for example, $1\times10^{19} cm^{-3}$.

The cavity length L of the semiconductor laser according to the second embodiment is chosen to be, for example, 640 μm, and the width in the direction vertical to the cavity length direction is chosen to be, for example, 400 μm, like in the semiconductor laser according to the first embodiment.

The p-type ZnTe/ZnSe MQW layer 15 is provided for the following purpose. That is, direct contact of the p-type ZnSe contact layer 9 with the p-type ZnTe contact layer 16 causes a large discontinuity in valence bands along their interface, which acts as a barrier against holes injected from the p-side electrode 11 to the p-type ZnTe contact layer 16. The barrier, however, is effectively removed by interposing the p-type ZnTe/ZnSe MQW layer 15.

That is, the maximum carrier concentration in p-type ZnSe is typically on the order of $5\times10^{17} cm^{-3}$ while the carrier concentration in p-type ZnTe can be $10^{19} cm^{-3}$. The discontinuity in valence band along an interface between p-type ZnSe and p-type ZnTe is about 0.5 eV. If the junction is a step junction, a band bending is produced over the width $$W = (2\epsilon \Phi_T / q N_A)^{1/2} \quad (1)$$

in the valence band of p-type ZnSe along the junction of p-type ZnSe and p-type ZnTe, where q is the absolute value of electron charges, $\epsilon$ is the dielectric constant of ZnSe, and $\Phi_T$ is the discontinuous potential (about 0.5 eV) in valence bands along the interface between p-type ZnSe and p-type ZnTe.

Figure 8:
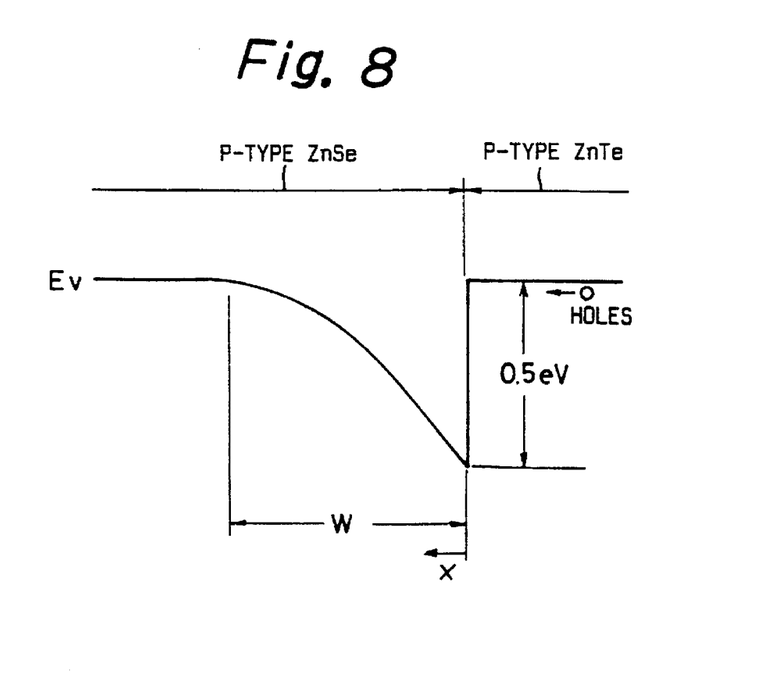
FIG. 8 is an energy band diagram showing valence bands near the interface between p-type ZnSe and p-type ZnTe.

Calculation of W using equation (1) results in W=32 nm. FIG. 8 shows how the top of the valence bands vary in this case along the direction vertical to the interface between p-type ZnSe and p-type ZnTe. Fermi levels of p-type ZnSe and p-type ZnTe are assumed to coincide with tops of the valence bands. As shown in FIG. 8, the valence band of p-type ZnSe bends downward toward p-type ZnTe in this case. Such a downward convex change of the valence band acts as a potential barrier against holes injected from the p-side electrode 11 to the junction of p-type ZnSe and p-type ZnTe.

This problem can be solved by providing the p-type ZnTe/ZnSe MQW layer 15 between the p-type ZnSe contact layer 9 and the p-type ZnTe contact layer 16. The p-type ZnTe/ZnSe MQW layer 15 is specifically designed, for example, as explained below.

Figure 9:
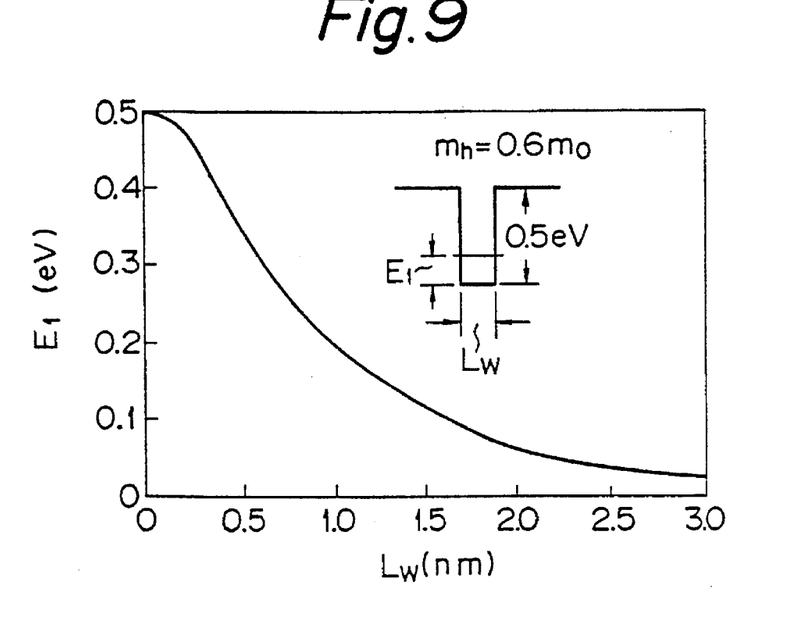
FIG. 9 is a graph showing changes in first quantum level $E_1$ with the width $L_W$ of a p-type ZnTe quantum well.

FIG. 9 shows a result of quantum-mechanical calculation on a well-type potential of a finite barrier to know how the first quantum level $E_1$ varies with respect to the width $L_W$ of a p-type ZnTe quantum well in a single quantum well structure sandwiching the p-type ZnTe quantum well layer by p-type ZnSe barrier layers. In the calculation, assuming the effective mass $m_h$ of holes in p-type ZnSe and p-type ZnTe, $0.6 m_O$ ($m_O$: mass of electrons at rest) was used as the mass of electron in the quantum well layer and the barrier layers, and 0.5 eV is used as the depth of the well.

It is known from FIG. 9 that the quantum level $E_1$ formed in the quantum well can be elevated by decreasing the width $L_W$ of the quantum well. The p-type ZnTe/ZnSe MQW layer 15 is designed by utilizing this.

In this case, the band bending appearing over the width W in the p-type ZnSe from the interface between the p-type ZnSe and the p-type ZnTe is given by the following quadratic function of the distance x from the interface between the p-type ZnSe and the p-type ZnTe (FIG. 8):

$$\Phi(x) = \Phi_T \{1 - (x/W)^2\} \quad (2)$$

Therefore, the p-type ZnTe/ZnSe MQW layer 15 can be designed on the basis of equation (2) by varying $L_W$ such that the quantum levels $E_1$ formed in the respective p-type ZnTe quantum well layers coincide with energies at the tops of the valence bands of the p-type ZnSe and the p-type ZnTe and also coincide with each other.

Figure 10:
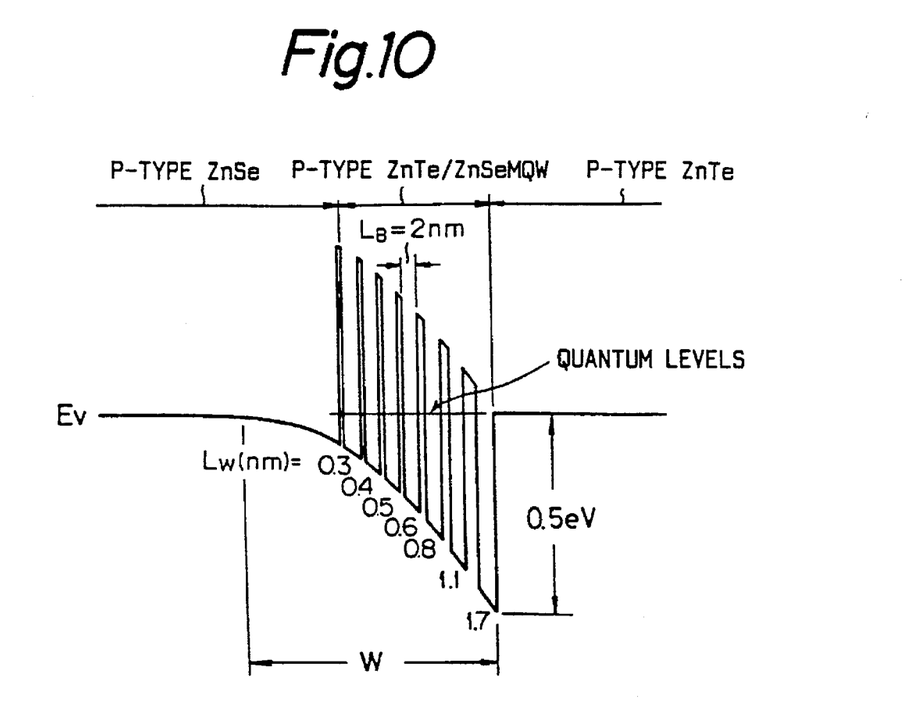
FIG. 10 is an energy band diagram showing an example of a design of a p-type ZnTe/ZnSe MQW layer in the semiconductor laser according to the second embodiment of the invention.

FIG. 10 shows an exemplary design of widths $L_W$ of quantum wells in the p-type ZnTe/ZnSe MQW layer 15 in which the width $L_B$ of each p-type ZnSe barrier layer is 2 nm, the acceptor concentration $N_A$ of the p-type ZnSe contact layer 9 is $5 \times 10^{17} cm^{-3}$, and the acceptor concentration $N_A$ of the p-type ZnTe contact layer 16 is $1 \times 10^{19} cm^{-3}$, As shown in FIG. 10, the exemplary design changes the widths $L_W$ of seven quantum wells from 0.3 nm to 0.4 nm, 0.5 nm, 0.6 nm, 0.8 nm, 1.1 nm and 1.7 nm from the p-type ZnSe contact layer 9 toward the p-type Znte contact layer 16 such that their quantum levels $E_1$ coincide with the Fermi levels of the p-type ZnSe and p-type Znte.

In a strict sense, since levels of the respective quantum wells are bound by each other, their interactions must be taken into consideration, and effects of distortions caused by lattice mismatching between quantum wells and barrier layers must also be incorporated, when designing the widths $L_W$ of the quantum wells. However, It is theoretically possible for quantum levels of the multiquantum well structure to be made flat as shown in FIG. 10.

In FIG. 10, since holes injected to the p-type ZnTe can flow to the p-type ZnSe by resonant tunnelling through the quantum levels $E_1$ formed in the respective quantum wells in the p-type ZnTe/ZnSe MQW layer 15, the potential barrier along the interface between the p-type ZnTe and the p-type ZnSe is removed effectively. Therefore, the semiconductor laser according to the second embodiment can realize good voltage-current characteristics and can reduce a great amount of voltage to be applied for oscillation of the laser.

The semiconductor laser according to the second embodiment can be fabricated by the same method as used for fabricating the semiconductor laser according to the first embodiment, which is therefore not explained here.

The second embodiment, like the first embodiment, can realize a semiconductor laser capable of emitting green light by continuous oscillation at room temperature and having the SCH structure with a low threshold current density. This semiconductor laser generates only a small amount of heat during operation, and can be fabricated easily. In particular, with the second embodiment, since the p-type ZnTe/ZnSe MQW layer 15 and the p-type ZnTe contact layer 16 are stacked on the p-type ZnSe contact layer 9 such that the p-side electrode 11 contacts with the p-type ZnTe contact layer 16, generation of heat from the semiconductor laser during its operation can be significantly reduced, and a significant amount of voltage applied for oscillation of the laser can be reduced.

Figure 11:
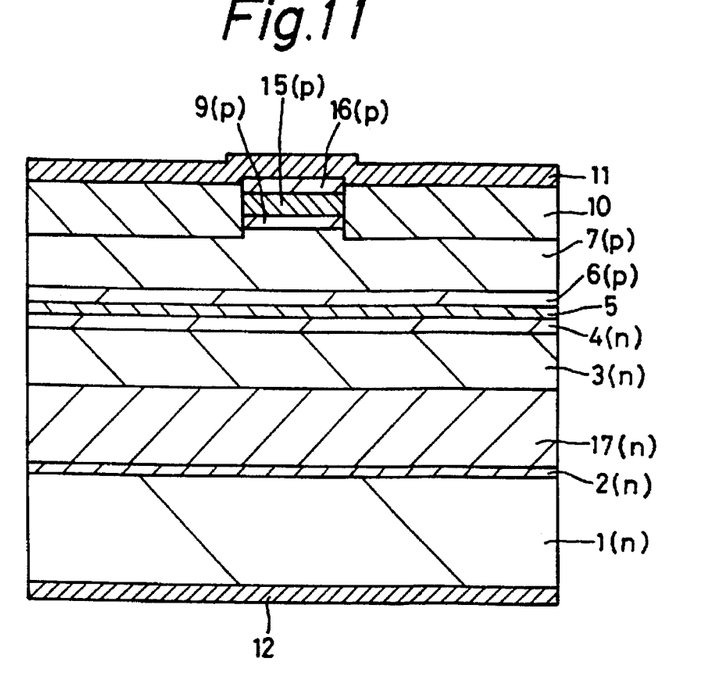
FIG. 11 is a cross-sectional view of a semiconductor laser according to a third embodiment of the invention.

FIG. 11 shows a semiconductor laser according to a third embodiment of the invention. The semiconductor laser according to the third embodiment also has an SCH structure.

As shown in FIG. 11, the semiconductor laser according to the third embodiment uses an n-type GaAs substrate 1 having the (100) orientation and doped with Si, for example, as an n-type impurity. Sequentially stacked on the n-type GaAs substrate 1 are an n-type ZnSe buffer layer 2 doped with, for example, Cl as an n-type impurity; an n-type $ZnS_VSe_{1-V}$ layer 17 doped with, for example, Cl as an n-type impurity; an n-type $Zn_{1-p}Mg_pS_qSe_{1-q}$ cladding layer 3 doped with, for example, Cl as an n-type impurity; an n-type ZnSe optical waveguide layer 4 doped with, for example, Cl as an n-type impurity; an active layer 5; a p-type ZnSe optical waveguide layer 6 doped with, for example N as a p-type impurity; a p-type $Zn_{1-p}Mg_pS_qSe_{1-q}$ cladding layer 7 doped with, for example, N as a p-type impurity; a p-type ZnSe contact layer 9 doped with, for example, N as a p-type impurity; a p-type ZnTe/ZnSe MQW layer 15; and a p-type ZnTe contact layer 16 doped with, for example, N as a p-type impurity.

That is, in the third embodiment, the n-type $ZnS_VSe_{1-V}$ layer 17 is stacked above the n-type GaAs substrate 1 via the n-type ZnSe buffer layer 2, and the n-type $Zn_{1-p}Mg_pS_qSe_{1-q}$ cladding layer 3 is stacked on the n-type $ZnS_VSe_{1-V}$ layer 17. The n-type $ZnS_VSe_{1-V}$ layer 17 has the same function as the p-type $ZnS_VSe_{1-V}$ layer 8 stacked on the p-type $Zn_{1-p}Mg_pS_qSe_{1-q}$ cladding layer 7 in the first embodiment. For example, the n-type $ZnS_VSe_{1-V}$ layer 17 is used as an n-type cladding layer together with the n-type $Zn_{1-p}Mg_pS_qSe_{1-q}$ cladding layer 3.

The other arrangement of the third embodiment is identical to that of the semiconductor according to the second embodiment, and is not explained here. The method for fabricating the semiconductor laser according to the third embodiment is also the same as that used for fabricating the semiconductor laser according to the second embodiment, and is not explained here.

According to the third embodiment, substantially the same advantages as those of the second embodiment can be obtained.

Figure 12:
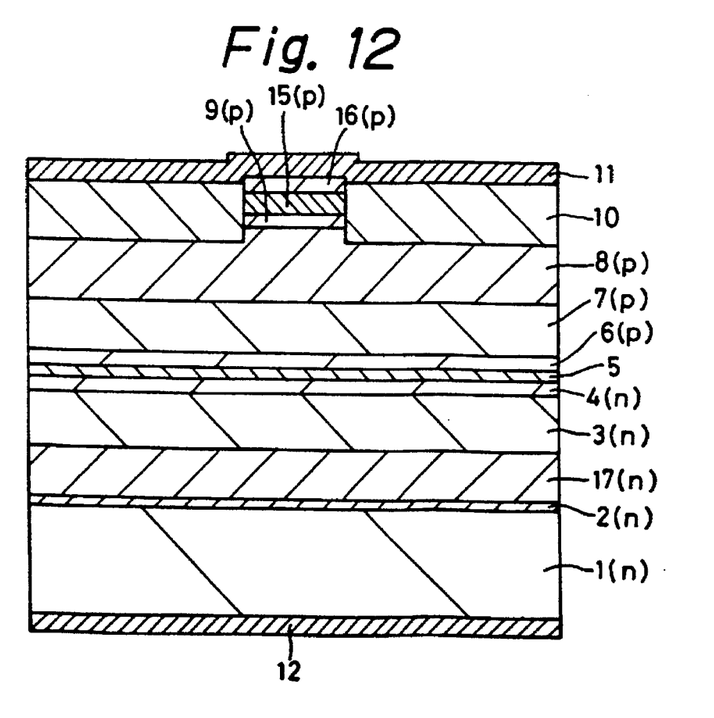
FIG. 12 is a cross-sectional view of a semiconductor laser according to a fourth embodiment of the invention.

FIG. 12 shows a semiconductor laser according to a fourth embodiment of the invention. The semiconductor laser according to the fourth embodiment also has an SCH structure.

As shown in FIG. 12, the semiconductor laser according to the fourth embodiment uses an n-type GaAs substrate 1 having the (100) orientation and doped with Si, for example, as an n-type impurity. Sequentially stacked on the n-type GaAs substrate 1 are an n-type ZnSe buffer layer 2 doped with, for example, Cl as an n-type impurity; an n-type $ZnS_vSe_{1-v}$ layer 17 doped with, for example, Cl as an n-type impurity; an n-type $Zn_{1-p}Mg_pS_qSe_{1-q}$ cladding layer 3 doped with, for example, Cl as an n-type impurity; an n-type ZnSe optical waveguide layer 4 doped with, for example, Cl as an n-type impurity; an active layer 5; a p-type ZnSe optical waveguide layer 6 doped with, for example, N as a p-type impurity; a p-type $Zn_{1-p}Mg_pS_qSe_{1-q}$ cladding layer 7 doped with, for example, N as a p-type impurity; a p-type $ZnS_vSe_{1-v}$ layer 8 doped with, for example, N as a p-type impurity; a p-type ZnSe contact layer 9 doped with, for example, N as a p-type impurity; a p-type ZnTe/ZnSe MQW layer 15; and a p-type ZnTe contact layer 16 doped with, for example, N as a p-type impurity.

That is, in the fourth embodiment, the p-type $ZnS_vSe_{1-v}$ layer 8 is stacked on the p-type $Zn_{1-p}Mg_pS_qSe_{1-q}$ cladding layer 7, like in the first and second embodiments, and the n-type $ZnS_vSe_{1-v}$ layer 17 is stacked above the n-type GaAs substrate 1 via the n-type ZnSe buffer layer 2 such that the n-type $Zn_{1-p}Mg_pS_qSe_{1-q}$ cladding layer 3 is stacked on the n-type $ZnS_vSe_{1-v}$ layer 17, like in the third embodiment.

In this case, both the p-type $Zn_{1-p}Mg_pS_qSe_{1-q}$ cladding layer 7 and the n-type $Zn_{1-p}Mg_pS_qSe_{1-q}$ cladding layer 3 can be minimized in thickness.

The other arrangement of the fourth embodiment is identical to that of the semiconductor according to the second embodiment, and is not explained here. The method for fabricating the semiconductor laser according to the fourth embodiment is also the same as that used for fabricating the semiconductor laser according to the second embodiment, and is not explained here.

According to the fourth embodiment, substantially the same advantages as those of the second embodiment can be obtained.

Figure 13:
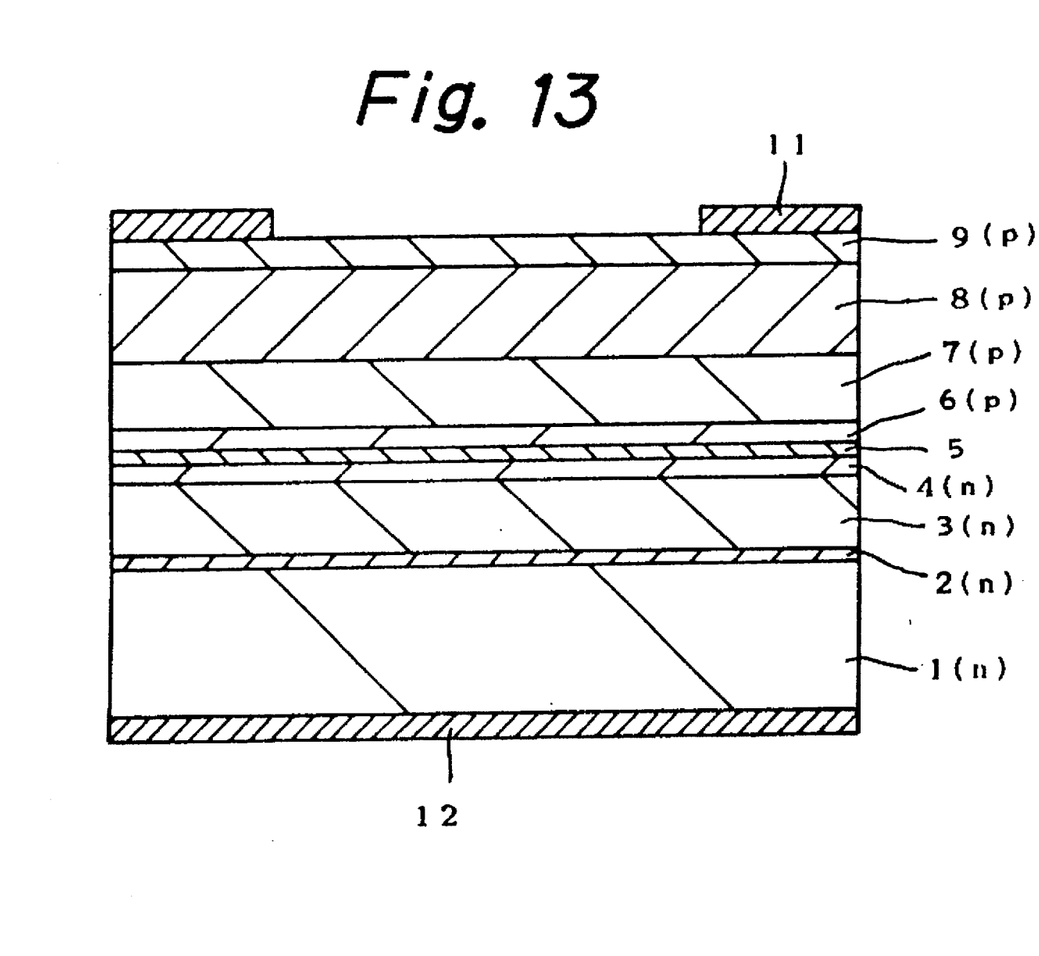
FIG. 13 is a cross-sectional view of a light emitting diode according to a fifth embodiment of the invention.

A fifth embodiment in which the invention has been applied to a light emitting diode will now be explained. FIG. 13 shows a light emitting diode according to the fifth embodiment.

As shown in FIG. 13, the light emitting diode according to the fifth embodiment uses an n-type GaAs substrate 1 having the (100) orientation and doped with Si, for example, as an n-type impurity. Sequentially stacked on the n-type GaAs substrate 1 are an n-type ZnSe buffer layer 2 doped with, for example, Cl as an n-type impurity; an n-type $Zn_{1-p}Mg_pS_qSe_{1-q}$ cladding layer 3 doped with, for example, Cl as an n-type impurity; an n-type ZnSe optical waveguide layer 4 doped with, for example, Cl as an n-type impurity; an active layer 5 made of, for example, i-type $Zn_{1-z}Cd_zSe$ quantum well layer; a p-type ZnSe optical waveguide layer 6 doped with, for example, N as a p-type impurity; a p-type $Zn_{1-p}Mg_pS_qSe_{1-q}$ cladding layer 7 doped with, for example, N as a p-type impurity; a p-type $ZnS_vSe_v$ layer 8 doped with, for example, N as a p-type impurity; a p-type ZnSe contact layer 9 doped with, for example, N as a p-type impurity.

In this case, a p-side electrode 11 having an opening used as a light take-out portion is provided on the p-type ZnSe contact layer 9. The portion where the p-side electrode 11 contacts the p-type ZnSe contact layer 9 behaves as a flow-path of the electric current. For example, an Au/Pt/Pd electrode is used as the p-side electrode 11 like in the first to fourth embodiments. The fifth embodiment is also the same as the first to fourth embodiments in that an n-side electrode 12 such as an In electrode contacts the back surface of the n-type GaAs substrate 1.

The method for fabricating the light emitting diode according to the fifth embodiment is also the same as that used for fabricating the semiconductor laser according to the first embodiment, and is not explained here.

The fifth embodiment can realize a light emitting diode capable of emitting, for example, green light with a low operation current density. The light emitting diode generates a small amount of heat during operation and is easily fabricated.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, the n-type ZnSe optical waveguide layer 4 and the p-type ZnSe optical waveguide layer 6 used in the first to fifth embodiments may be replaced by i-type ZnSe optical waveguide layers. From the viewpoint of lattice matching, it is desirable to use an n-type $ZnS_uSe_{1-u}$ and a p-type $ZnS_uSe_{1-u}$ or i-type $ZnS_uSe_{1-u}$ layers of u=0.06 in lieu of the n-type ZnSe optical waveguide layer 4 and the p-type ZnSe optical waveguide layer 6.

Although the first to fifth embodiments irradiate $N_2$ plasma generated by ECR for doping N as a p-type impurity into the p-type ZnSe optical waveguide layer 6, p-type $Zn_{1-p}Mg_pS_qSe_{1-q}$ cladding layer 7, p-type $ZnS_vSe_{1-v}$ layer 8, p-type ZnSe contact layer 9, and p-type ZnTe contact layer 16, doping of N may be done, for example, by irradiating $N_2$ excited by a high frequency plasma.

Further, the GaAs substrate used in the first to fifth embodiments as a compound semiconductor substrate may be replaced with, for example, a GaP substrate.

Although the first to fourth embodiments have been described as applying the invention to semiconductor lasers having an SCH structure, the invention may be applied to a semiconductor laser having a DH (double heterostructure) structure.

Further, a transparent electrode may be used as the p-side electrode 11 in the fifth embodiment in lieu of an Au/Pt/Pd electrode and the transparent electrode may be formed on the entire surface of the p-type ZnSe contact layer 9.

As described above, the invention can realize a semiconductor light-emitting device using ZnMgSSe compound semiconductors as materials of cladding layers and capable of emitting blue to green light, which has good optical confinement characteristics and carrier confinement characteristics, generates only a small amount of heat during its operation, and is fabricated easily.

What is claimed is:

1. A semiconductor light-emitting device comprising:
   a first cladding layer of a first conduction type stacked on a compound semiconductor substrate and made of a ZnMgSSe compound semiconductor;

an active layer stacked on said first cladding layer; and a second cladding layer of a second conduction type stacked on said active layer and made of a ZnMgSSe compound semiconductor, wherein a ZnSSe compound semiconductor layer is provided on said second cladding layer.

2. The semiconductor light-emitting device according to claim 1 wherein said ZnSSe compound semiconductor layer is 0.1–2 μm thick, and said second cladding layer is 0.2–2 μm thick.

3. The semiconductor light-emitting device according to claim 1, wherein said second cladding layer and said ZnSSe compound semiconductor layer are of p-type, and a p-type contact layer made of a ZnSe compound semiconductor is stacked on said ZnSSe compound semiconductor layer.

4. The semiconductor light-emitting device according to claim 1 wherein said active layer is made of a ZnCdSe compound semiconductor.

5. The semiconductor light-emitting device according to claim 1 wherein said compound semiconductor substrate is a GaAs substrate.

6. A semiconductor light-emitting device comprising:

a first cladding layer of a first conduction type stacked on a compound semiconductor substrate and made of a ZnMgSSe compound semiconductor;

an active layer stacked on said first cladding layer; and a second cladding layer of a second conduction type stacked on said active layer and made of a ZnMgSSe compound semiconductor, wherein a ZnSSe compound semiconductor layer is provided on said second cladding layer and between said compound semiconductor substrate and said first cladding layer.

7. The semiconductor light-emitting device according to claim 6 wherein said ZnSSe compound semiconductor layer between said compound semiconductor substrate and said first cladding layer is 0.01–2 μm thick, said ZnSSe compound semiconductor layer on said second cladding layer is 0.1–2 μm thick, said first cladding layer is 0.2–2 μm thick, and said second cladding layer is 0.2–2 μm thick.

8. The semiconductor light-emitting device according to claim 7 wherein said second cladding layer and said ZnSSe compound semiconductor layer are of p-type, and a p-type contact layer made of a ZnSe compound semiconductor is stacked on said ZnSSe compound semiconductor layer.

9. The semiconductor light-emitting device according to claim 8 wherein said p-type contact layer is 30–150 nm thick.

10. The semiconductor light-emitting device according to claim 6 wherein said active layer is made of a ZnCdSe compound semiconductor.

11. The semiconductor light-emitting device according to claim 6 wherein said compound semiconductor substrate is a GaAs substrate.

* * * * *